United States Patent
Eisenbraun

(10) Patent No.: US 7,808,106 B1
(45) Date of Patent: Oct. 5, 2010

(54) NANO-LAMINATE DIFUSSION BARRIER FOR DIRECT ELECTROCHEMICAL DEPOSITION COPPER

(76) Inventor: Eric Eisenbraun, 6 Pasture Gate La., Delmar, NY (US) 12054

(*) Notice: Subject to any disclaimer, the term of this patent is extended or adjusted under 35 U.S.C. 154(b) by 0 days.

(21) Appl. No.: 12/118,671

(22) Filed: May 9, 2008

(51) Int. Cl.
*H01L 23/52* (2006.01)
*H01L 21/44* (2006.01)

(52) U.S. Cl. .................. 257/751; 438/653; 438/686

(58) Field of Classification Search .............. 438/648, 438/650, 653, 686; 257/751, 761, E23.16
See application file for complete search history.

(56) References Cited

U.S. PATENT DOCUMENTS

| | | | |
|---|---|---|---|
| 6,713,373 B1 * | 3/2004 | Omstead | 438/608 |
| 7,264,846 B2 * | 9/2007 | Chang et al. | 427/248.1 |
| 7,279,432 B2 * | 10/2007 | Xi et al. | 438/763 |
| 2004/0224475 A1 * | 11/2004 | Lee et al. | 438/399 |

* cited by examiner

*Primary Examiner*—Calvin Lee
(74) *Attorney, Agent, or Firm*—Semiconductor Research Corporation

(57) ABSTRACT

A plasma enhanced atomic layer deposition (PEALD)-grown mixed-phase/nano-laminate barrier having the robust barrier properties of TaN with direct plate characteristics of Ru. Ru:TaN layers as thin as 5 nm act both as robust copper barrier and as a copper direct plating layer. Direct plated copper films exhibit preferred (111) orientation with the use of medium acid level electrolyte (0.8M $H_2SO_4$) and higher plating current density (10 $mA/cm^2$) during the copper electrochemical deposition process. (111) texture in the direct plated copper films improves as Ru content in the mixed-phase barrier is increased. Direct plated copper films possess larger grain size characteristics as compared to copper electroplated on PVD copper seed. The filling characteristics in sub-65 nm features are equivalent for seeded copper and Ru:TaN barrier films without a seed layer.

6 Claims, 4 Drawing Sheets ns
NANO-LAMINATE DIFUSSION BARRIER FOR DIRECT ELECTROCHEMICAL DEPOSITION COPPER

FIELD OF THE INVENTION

The present invention relates to atomic layer deposition and, in particular, semiconductor interconnect structures using atomic layer deposition of alternating lamina to produce a monolithic diffusion barrier for the direct electrochemical deposition of copper on patterned substrates.

BACKGROUND OF THE INVENTION

The downscaling of integrated circuit devices, and in particular multilevel interconnect structures, has required concerted efforts to reduce electrical resistance while maintaining current densities For filling high aspect conductive patterns such as trenches, vias, contacts and other features, bulk copper has been applied using electrochemical deposition (ECD) over a sputtered copper seed layer to achieve plated copper adhesion, microstructure, and electromigration characteristics. Multiple barrier layers have been utilized to prevent copper diffusion into the substrate. In one approach, tantalum-tantalum nitride barriers have been used for their ability to prevent diffusion into the lower dielectric substrates. Atomic layer deposition of a discrete layer of tantalum nitride as a diffusion barrier overlaid with a discrete layer ruthenium as an adhesion layer has also been proposed as disclosed in U.S. Pat. No. 7,273,814. Both multiple layer barriers and the attendant seed layer are necessarily complex and relatively thick limiting the down scaling of interconnect structures in nanoelectronics. The application of direct plating of copper on a diffusion barrier without the need for discrete copper nucleation and seed layers has been recognized as an approach for reducing interconnect thickness (ref. 1). Unfortunately, none of the materials known to be appropriate for direct copper plating, such as Ru, Pt, or Ir, also serve as robust barrier materials, primarily due to microstructural issues (ref. 2). Likewise, candidate barrier materials such as TaN and TaSiN are not appropriate for direct plating due to their surface chemistry characteristics (3). Each layer must possess a minimal thickness of several nanometers, intrinsically limiting the minimum thickness of the dual layer approach. Accordingly, it would be desirable to provide reduced thickness diffusion barriers that can be directly copper plated.

SUMMARY OF THE INVENTION

The present invention provides a novel interconnect structure wherein a plasma enhanced atomic layer deposition (PEALD)-grown mixed-phase/nano-laminate barrier (Ru: TaN) possesses suitable properties for acting both as a robust diffusion barrier for copper as well as possessing appropriate surface chemical characteristics to allow direct ECD of copper without the need for a discrete copper seed layer. Alternating sequences of individual plasma enhanced ALD (PEALD) Ru and PEALD TaN layers are used for the growth of the mixture, and the ratio of Ru to TaN is controlled by modulating the number of deposition cycles of each individual material. The nano-laminate barrier is thinner that the prior individual layers while still possessing adequate functionality. The process may also provide a graded composition material, with the upper layer being Ru rich so as to enhance direct plate characteristics of the barrier and the lower layer Ta rich to enhance diffusion characteristics.

The nano-laminates, in thicknesses of 5 to 25 nm, have an electrical resistivity and thermal stability, as well as the subsequent copper plating and diffusion barrier characteristics, dependent upon the Ru:Ta ratio. Nano-laminates as thin as 5 nm with Ru:Ta ratios in the range of 8 to 16 act both as robust copper barrier and as copper direct plating layer.

According to one aspect of the invention there is provided a microelectronic substrate including a patterned substrate having depressions in the form of vias and/or trenches; a barrier on the exposed surfaces of said depressions comprising a plurality of alternating lamina I of tantalum nitride (TaN) and ruthenium (Ru) applied by atomic layer deposition wherein the ratio of ruthenium to tantalum is effective for providing an exposed outer layer suitable for the direct electroplating of copper and the layer is effective for limiting the diffusion of copper into the substrate. The barrier may include at least four alternating lamina with a bottom layer at said substrate consisting of tantalum nitride and an outer layer consisting of ruthenium. The ratio is in the range by weight of about 8 to 16 and preferred in the range by weight of about 10 to 14. The voids may be filled with electroplated copper. Each of the lamina will have a thickness of about 2 nm or less.

According to another aspect, the invention provides a method for forming a microelectronic substrate comprising depositing on the substrate by atomic layer deposition plural alternating layers of tantalum nitride and ruthenium to form a barrier wherein the ratio by weight of ruthenium to tantalum is in the range of about 8:1 to 16:1 and effective for direct electroplating of copper on said barrier and limiting diffusion of copper therethrough. The layer of tantalum nitride may be formed with t-butyllimino-tris (diethylamino) tantalum (TBTDET) as a precursor material. The layer of ruthenium may be formed with ethyl methyl ruthenocene as a precursor material. The layers are preferably formed using a plasma enhanced atomic layer deposition using a nitrogen containing compound such as ammonia as a reactant.

A further aspect is to provide An interconnect structure for microelectronic substrates including a patterned substrate having depressions in the form of vias and/or trenches each defined by spaced side walls and a base wall; an inner lamina of tantalum nitride on said side walls and said side walls having a thickness of about 2 nm, interior lamina on said inner lamina successively consisting of alternating layers of ruthenium and tantalum nitride each having a thickness of about 2 nm at terminating with an outer intermediate lamina of tantalum nitride, and a outer lamina of ruthenium overlying said interior lamina and having a thickness of about 2, said outer surface of said outer lamina for the wall of a cavity, and a copper material filling said cavity wherein said lamina are formed by plasma enhanced atomic layer deposition and wherein the ratio of ruthenium to tantalum is effective for providing an exposed outer layer suitable for the direct electroplating of copper and the layer is effective for limiting the diffusion of copper into the substrate.

BRIEF DESCRIPTION OF THE DRAWINGS

The above and other advantages of the invention will become apparent upon reading the following written description taken in conjunction with the accompanying drawings in which.

DESCRIPTION OF THE PREFERRED EMBODIMENTS

Figure 1:
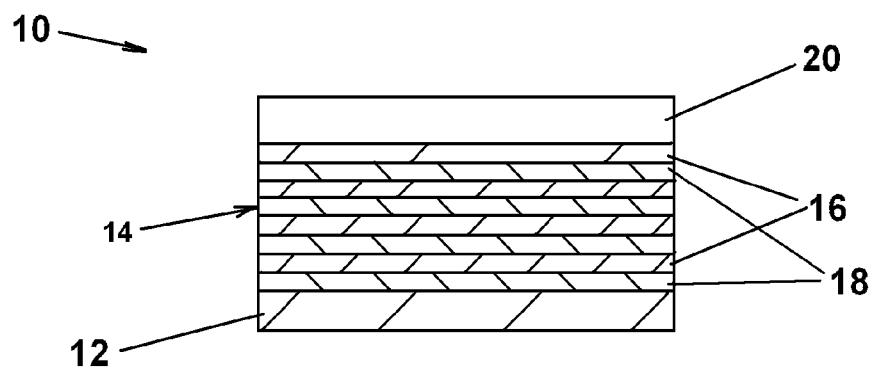
FIG. 1 is a schematic view of a nano-laminate in accordance with an embodiment of the invention.

Referring to FIG. 1 for the purpose of illustrating a preferred embodiment and not for limiting same, there is shown a composite nano-laminate 10 comprising a base substrate 12 clad with an alloy layer diffusion barrier 14 of alternating ruthenium lamina 16 and tantalum nitride lamina 18 terminating with a direct plated copper lamina 20. The barrier layer 14 is characterized by atomic layer depositions of the lamina in varying thicknesses, of 2 nm or less, to provide a desired Ru/TaN alloy ratio, by weight, preferably terminating adjacent the base substrate with a predominant TaN lamina and terminating at the copper lamina 20 with a predominant Ru lamina. The resultant laminate possesses monolithic properties providing diffusion barrier properties at the substrate and adhesion properties at the top enabling direct electroplating of the copper lamina. The properties are achieved at a resultant thickness less than the above described discrete layers, and without requiring a seed layer for the electroplating.

The reduced profile is beneficial in the metallization of interconnect and intraconnect structures for semiconductor devices. The laminate may be deposited on high aspect wiring trenches and vias and without requiring seed layers provide for bulk metal fill.

Figure 2:
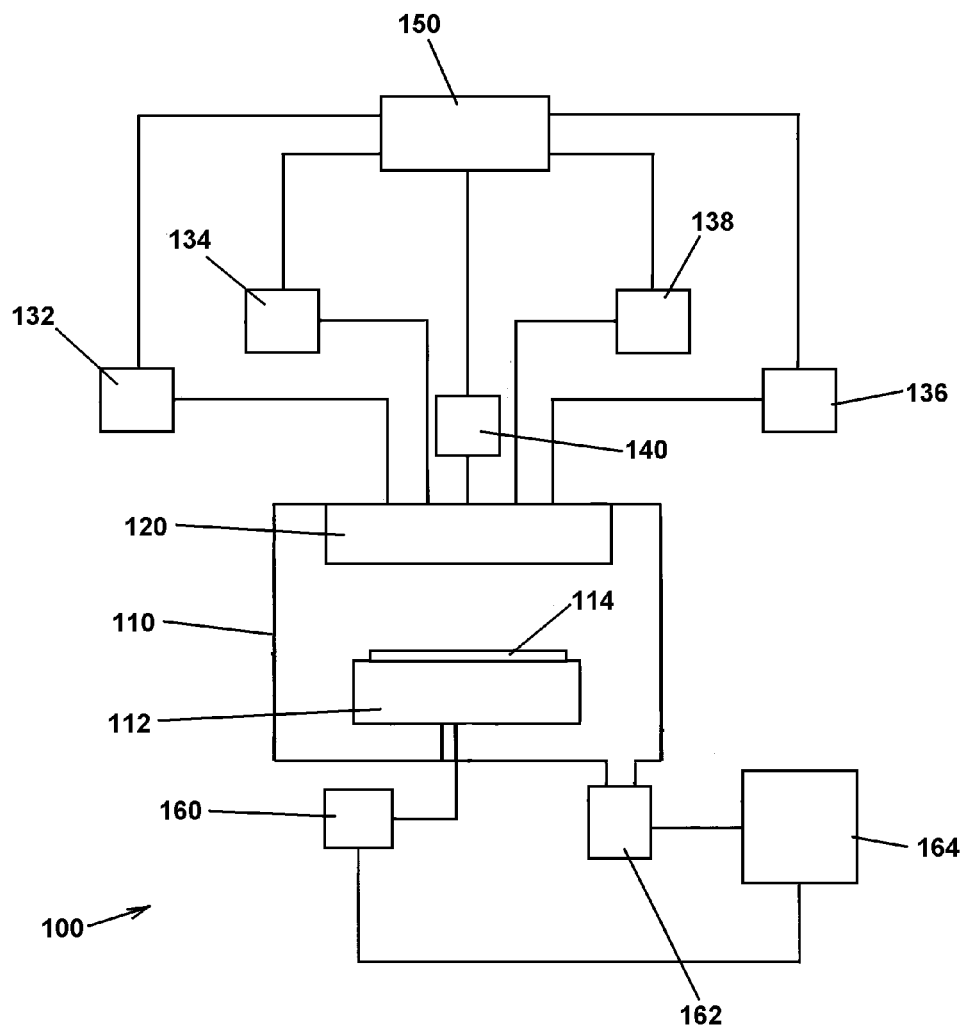
FIG. 2 is a schematic view of a nano-laminate deposition system for the laminate of FIG. 1.

Referring to FIG. 2, the nano-laminate deposition system 100 for producing the diffusion barrier on the substrate comprises a process chamber 110 having a substrate holder 112 for supporting the substrate 114. The chamber 110 includes a top assembly 120 coupled with a first precursor supply system 132, a second precursor supply system 134, a reactant supply system 136 and a purge gas supply system 138. The system 100 includes a power source 140 for generating a plasma in the chamber 110. The supply systems 132, 134, 136 and 138, and the power source 140 are operatively coupled with a controller 150. Additionally, a substrate temperature control system 160, and a chamber evacuation system 162 are coupled a controller 164 for controlling the temperature of the substrate and for establishing process vacuum and evacuating the chamber following process cycles. Preferably, the lines from the supply systems 132, 134 are heated to allow independent flow control of both precursors.

Figure 3:
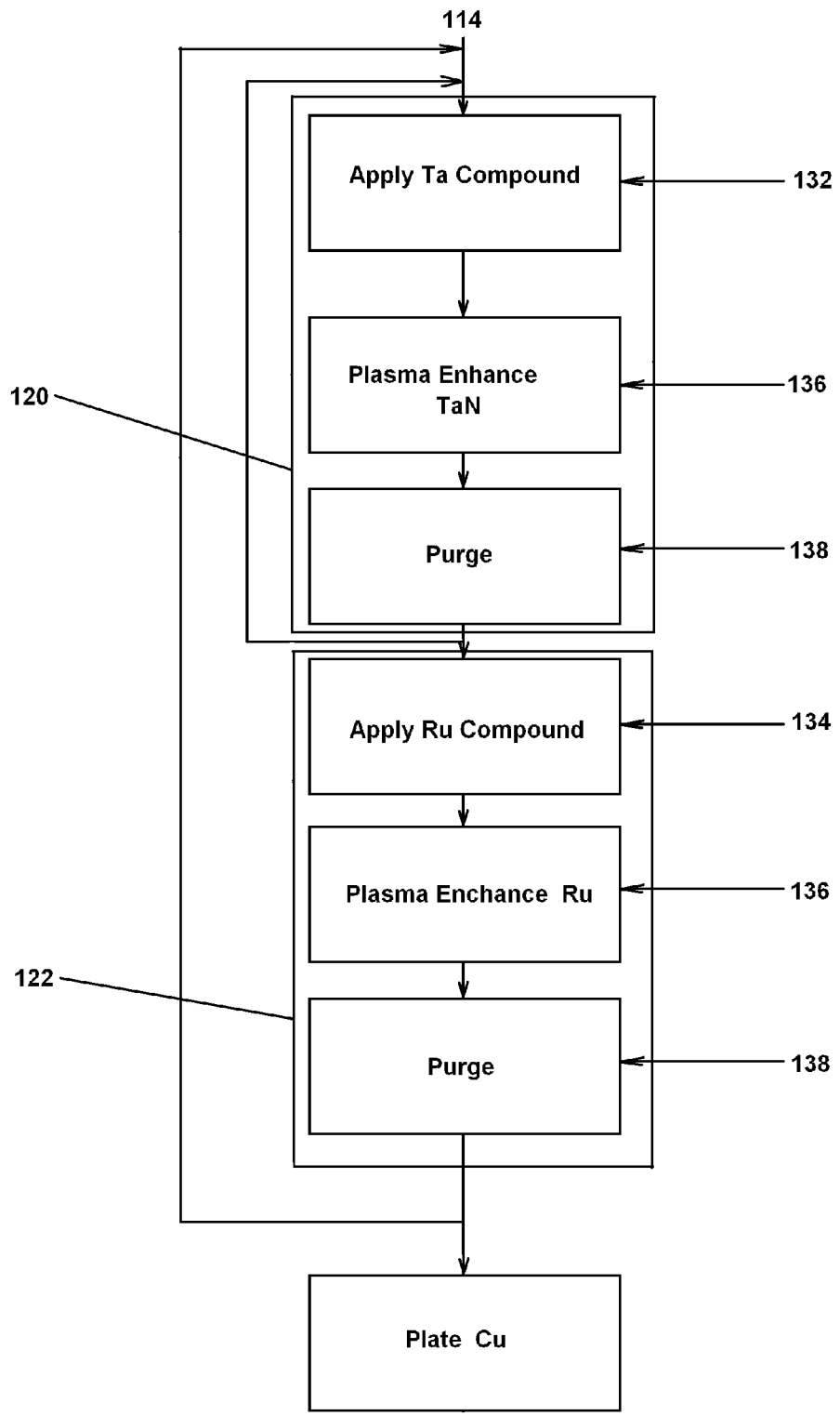
FIG. 3 is a block diagram for the process for the deposition system.

Referring additionally to FIG. 3, depending on the alloy ratio being produced, the supply systems 132, 134 are selectively actuated at the controller 150 to introduce controlled amounts material from the supply sources into the chamber 110 in short duration pulses, 10 seconds or less, for each atomic layer deposition, in an alternating TaN application cycle 200 and a Ru application cycle 210. For an exemplary 12:1 Ru:Ta ratio, the substrate 114 is loaded through a vacuum lock, not shown, into the chamber and the chamber evacuated to a pressure of about 50 mtorr. The tantalum compound, TBTET, is introduced into the chamber from source 132 at a flow rate of about 0.12 sccm for a pulse time of about 5 seconds, and applied to the substrate at "Apply Ta Compound". The chamber 110 is then purged from source 138 with argon at about 50 sccm for a first purge cycle of about 10 seconds. Thereafter, the reactant material, NH$_3$ from the reactant supply system 136 is introduced at "Plasma Enhanced TaN" at a flow rate of about 150 sccm for a pulse time of about 5 seconds to the chamber and the power source 140 energized to react at the applied layer, followed by a purge gas, Argon, from the purge gas supply system 138 introduced at "Purge" for a second purge cycle of 5 seconds at a flow rate of about 50 sccm to remove contaminants and residuals from the chamber through the chamber evacuation system. The TaN application cycle 200 is repeated until the desired thickness for the TaN lamina is achieved for the Ru/TaN ratio of the barrier. For a 12:1 ratio and a four-layer barrier, a pulse ratio of about 6:1 of Ru:Ta is used. After achieving the lamina thickness, the Ru application cycle 122 is initiated by introducing the Ru compound, ethyl methyl ruthenocene, from source 134 to apply a Ru coating on the TaN layer at "Apply Ru Compound" for a pulse time of about 5 seconds and a flow rate of about 0.7 sccm. After a first purge as described above, the reactant material, from the reactant supply system 136 is introduced to the chamber and the power source 140 energized to react at the applied layer at "Plasma Enhanced Ru", and a purge gas from the purge gas supply system 138 introduced at "Purge" in a second purge cycles as described above to remove contaminants and residuals from the chamber through the chamber evacuation system. The Ru application cycle 210 is repeated until the desired thickness for the Ru lamina is achieved for the Ru/TaN ratio of the barrier. The TaN application cycle 200 and Ru application cycle are repeated until a diffusion barrier of desired thickness and alloy ratio is achieved. For a thickness of about 6-8 nm, four layers are provided: i.e. TaN—Ru—TaN—Ru. If desired, the initial and terminal lamina may be rich or predominant in Ta and Ru respectively to enhance further to interface properties. Thereafter, the substrate with the mixed phase diffusion barrier is removed from the chamber and transferred to a plating operation for application of a copper plating at "Plate Cu".

Figure 4:
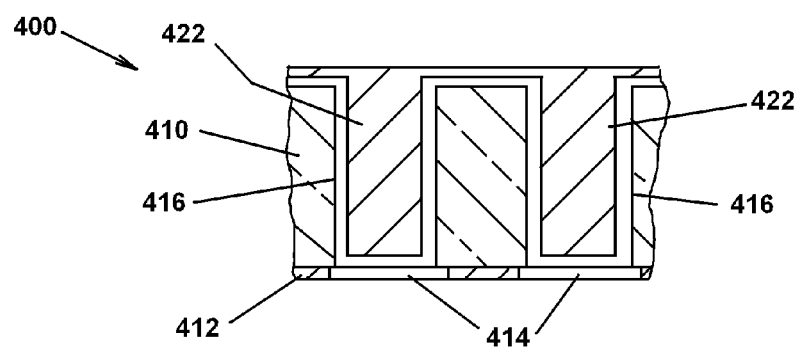
FIG. 4 is a schematic drawing of a patterned substrate with a nano-laminate barrier and metal fill.

The resultant product is schematically illustrated in FIG. 4. Therein, a patterned substrate 400 includes a dielectric layer 410 on a lower substrate 412. The lower substrate 412 may include a lower level interconnect or the like underlying depressions in the form of vias or trenches 414 formed in the dielectric layer 410. The base wall and side walls of the trenches 414 and the top surface of the dielectric layer are clad in the Ru:TaN diffusion barrier 420 as described above. The resultant cavity in the clad trenches is filled with copper fill 422 in the plating operation. The top surface of the patterned substrate may undergo further processing as required by the application such as planarizing in a chemical mechanical polishing process.

The resultant diffusion barrier on the substrate is a mixed phase deposition of alternating layers of tantalum nitride (TaN) and Ru deposited in situ on a base substrate. For microelectronics, the substrate is a suitable dielectric material, such as SiO$_2$, or low-k dielectric (porous SiCOH, k~2.3) substrates.

The precursor for the TaN is may be in liquid, gaseous or solid form at ambient temperature and processed in the supply system 120 for delivery in an inert carrier gas to the chamber. Conventional exemplary tantalum compounds include, for example t-butylimino-tris (diethylamino) tantalum (TBT-DET), pentakis (ethymethylamino) tantalum (PEMAT) pentakis (dimethylamino) tantalum (PDMAT), pentakis (diethylamino) tantalum (PDEAT), t-butylimino-tris (diethyamino) tantalum (TBTDET), t-butylamino-tris (ethylmethylamino) tantalum (TBTMET), t-butylimino-tris (dimethylamino) tantalum (TBTDMT), and other tantalum compounds recognized as effective in ALD and PEALD deposition. TBTDET is a preferred compound and used in the hereinafter described examples.

The purge gas comprises an inert gas, such as a noble gas including helium, neon, argon, xenon, and krypton, or nitrogen or hydrogen. Argon was used as the purge gas in the hereinafter described examples.

The reactant gas comprise nitrogen containing compounds include by example and not limitation, ammonia, activated dinitrogen, hydrazine, methyl hydrazine and other nitrogen compound recognized as effective in ALD and PEALD deposition.

Ammonia was used as the reactant gas for both TaN and Ru deposition in the hereinafter described examples.

Exemplary ruthenium compounds may be in solid or liquid form and include (2,4-dimetylpentadienyl (ethylclycopentadienyl) ruthenium, bis (2,4-dimethylpentadienyl ruthenium, 2,4-dimethylpentadienyl (methylcyclopentadienyl) ruthenocene, ruthenocence, diethyl ruthenocene and ethyl methyl ruthenocene and other ruthenocene compounds recognized as effective in ALD and PEALD deposition.

The Ru/TaN ratio has been demonstrated to provide desirable barrier and adhesion properties in an effective ratio of about 4 to 20 Ru:Ta and a preferred ratio of 8 to 16. Particularly, performance characteristics for interconnect applications at a thickness of 25 nm or less have be demonstrated in the above preferred ratio with better results at a ratio of about 12. Performance for diffusion and plating comparable to dual discrete layer thickness of 10 nm according to prior art barrier have been achieved at thickness of 6 nm or less in accordance with the made and described above. At such thickness and ratio, a plurality of alternating lamina are established, preferably at least one set/nm.

The above features and advantages are evidenced in the following examples.

EXAMPLES

Substrates

The substrates for testing comprised blanket SiO2 substrates and patterned substrates with 50 nm. trenches and. Patterned low-k dielectric (porous SiCOH, k~2.3) substrates with 65 nm trenches and via features.

Plating

Copper plating was carried out using a custom plating system, employing a bath comprised of 0.8M $H_2SO_4$ (medium acid concentration), 0.8M $CuSO_{4.5}H_2O$, 1.4 mM HCl and a Viaform additive package from Enthone Inc. Also, electrolyte with low acid concentration (0.1 M $H_2SO_4$) and current density of 1.25 to 10 $mA/cm^2$ were also used to determine direct plate characteristics of Ru:TaN barrier films. In order to minimize plating artifacts related to surface contamination, plating experiments were carried out less than 24 hours after barrier formation. Similarly, to avoid thermal aging of the plated samples, samples were stored in liquid nitrogen after electroplating.

Test Equipment

Cyclicvolammogram study using a $Hg/HgSO_4$ reference electrode was performed on air exposed Ru:TaN liner films to characterize degree of liner surface oxidation. A Scintag X-ray diffractometer (θ-2θ scans and pole figures analyses) and JEOL 2010F high resolution transmission electron microscope (HRTEM) were used to investigate plated copper film texture on blanket and patterned substrates respectively. LEO 1550 Scanning electron microscope (SEM) and FEI 200 Focused Ion Beam (FIB) systems were used for microstructural analyses. Ru:TaN barrier composition was determined by using Thermo VG-Scientific Theta Probe X-ray Photoelectron Spectroscopy (XPS). Furthermore, triangular voltage sweep (TVS) testing approach was employed for quantitative investigation of copper diffusion characteristics of the barrier films. Four-point probe measurements were done to measure electrical resistance of the Ru:TaN barriers and plated copper films.

Results

Ru:TaN Barrier Structure and Composition

A high resolution transmission electron microscopy (HR-TEM) image of a 4.8 nm thick Ru:TaN nano-laminate barrier deposited on a blanket $SiO_2$ substrate demonstrated that the applied diffusion barrier is smooth and continuous. The individual lamina or layers of Ru and TaN were indistinguishable in the image, indicating the presence of a mixed phase layer of less than 1 nm deposition for each individual layer. At such thicknesses, the Ru and TaN lamina are not discrete and continuous, but rather intermix with each other. An XPS depth profile analysis was also consistent with a continuous distribution of Ru and TaN throughout the thickness of the film. Barrier film density was found to be 10-13 $gm/cm^3$ by X-ray reflectivity (XRR) measurements The ratio of Ru to TaN in the barrier was modulated by varying the number of ALD growth cycles for individual layers of Ru and TaN, and provided excellent control over film composition. Electrical resistivity on films of varying ration indicates that films with higher Ru/Ta ratios exhibit lower resistivity owing to lower bulk resistivity of Ru (ρ=7.1 μΩ-cm) as compared to TaN (bulk resistivity ρ~80 μΩ-cm). Prior investigations, ALD Ru:TaN films had been shown to have superior chemical and thermal stability when compared to pure ALD Ru and ALD TaN films (ref. 4).

Direct Plating on Ru:TaN Films

Direct plating was investigated on blanket Ru:TaN films having a plated area, 1-4 $cm^2$, and a sheet resistance<400 Ω/square (Ru/Ta ratio ~10-30). A cyclovoltammogram (CV) scan on a blanket substrate with a 5 nm thick Ru—TaN (Ru/Ta=24:1) revealed the presence of a small hysteresis effect in the CV consistent with the presence of a thin native surface oxide formation between the barrier and the plating. In order to remove surface contamination and native surface oxide formation due to air exposure, barrier films were annealed in forming gas (95% Ar-5% $H_2$) at 150° C. prior to direct plating. The subsequently direct plated Cu layer was adherent and pure, with a resistivity of ~6-9 μohm-cm.

Effect of Plating Current Density:

To investigate the effect of current density on plated copper film characteristics, a 5 nm thick Ru—TaN film with a 24:1 Ru/Ta ratio was employed. The electrolyte bath was comprised of a medium acid level (0.8M $H_2SO_4$), 0.8M $CuSO_{4.5}H_2O$, 1.4 mM HCl base solution, and a Viaform additive package (Enthone, Inc.) was used for this study. XRD 0-20 normal scans of the resulting plated copper films showed the presence of Cu (111) and (200) reflections. Films plated using higher current density resulted in preferred (111) orientation, which is similar to the phenomenon observed by Chang et al. (ref. 5) for plating on PVD copper seed. As the plating current density increased, the plating process transitions from charge-transfer controlled reaction to mass-transfer controlled reaction at the electrode surface resulted in a denser film deposition with fewer defects. As a result, (111) crystallographic orientation in the plated copper films increased because (111) plane is the closed packed plane in FCC copper with lowest surface energy. Top down scanning electron microscopy (SEM) analyses of these films suggests that deposited copper film porosity decreases as the plating current density increases.

Effect of Different Acid Levels in Electrolyte:

Plating bath conductivity greatly depends on the amount of acid level in the solution. Thus, in turn, affects the plated copper film microstructure and its other properties. This was demonstrated at different acid levels in the plating bath A 5 nm thick Ru:TaN film with Ru/Ta ratio of 24:1 was direct plated by using low acid electrolyte (0.1 M $H_2SO_4$) and medium acid electrolyte (0.8 M $H_2SO_4$). All other constituents of both plating baths were kept same. The copper film plated using the medium acid electrolyte exhibited preferred (111) orientation for a plating current density of 5 mA/cm$^2$, which is favorable for higher electromigration resistance of plated copper films. Also, plane view SEM analyses indicated that films plated using the medium acid electrolyte were denser as compared to films plated using the low acid electrolyte, which is because of higher plating bath conductivity for the medium acid level electrolyte. A higher plating bath conductivity drives the plating process towards mass transfer controlled reaction on the electrode surface, and results in the dense film deposition.

Effect of Ru:TaN Barrier Composition:

Films 5 nm thick with a series of different Ru/Ta ratios (12, 24, and 30) were investigated. Direct plating was performed using a medium acid chemistry (0.8 M $H_2SO_4$) electrolyte bath. The plating current density was further increased to 10 mA/cm$^2$, which was observed to improve the (111) texture in the plated copper films on Ru:TaN=24 The direct plated copper films become highly (111) textured as the percentage of Ru in the barrier increases thought to be due to lower resistivity of the barrier film as the Ru/Ta ratio increases, which results in a more uniform plating overpotential, and thus a uniform current density distribution, over the barrier surface. This in turn improves the (111) texture in the plated copper. As relative thickness of Ru and TaN layers changes with change in the barrier composition, the resulting non-continuous surface layer with different distributions of Ru and TaN on the barrier surfaces can also affect the plating characteristics of the films.

Direct Plating vs. Plating on PVD Copper Seed

Blanket and patterned structures were employed to understand and compare plating characteristics over PVD copper seed and seedless Ru:TaN barrier substrates. A medium acid concentration electrolyte and plating current density of 10 mA/cm$^2$ applied for 20 seconds were used.

For blanket films, a 5 nm thick Ru:TaN barrier (Ru/Ta=30:1) and 12 nm PVD copper seed were employed and electroplated using current density of 10 mA/cm$^2$ and medium acid level electrolyte. XRD θ-2θ scans and pole figure analyses of plated copper films indicated similar plating characteristics of Ru:TaN and PVD copper seed. Although both films result in strong (111) texture in the plated copper films, direct plated copper (on Ru:TaN) was found to possess generally larger (111) oriented grain size (45±4 nm) characteristics as compared to plated copper on copper seed (29±1 nm). Grain size calculations were performed by employing Sherrer's formula (ref. 6). The large grain characteristics of Cu plated directly on the Ru:TaN barrier is thought to be due to lower nuclear density on the surface, which is characteristic of plating on amorphous barriers (ref. 7,8). On the other hand, PVD copper seed ensures dense nucleation due to its polycrystalline grain structure and results in smaller grains in the plated copper films.

For patterned structures one ne key scalability issue with copper plating involves the ability to completely fill sub-65 nm structures in the presence of underlying barrier, adhesion, and seed layers. Also, this tri-layer configuration is relatively thick and occupies a large effective fraction of the interconnect structure. Therefore, the viability of direct plating on the present diffusion barrier would be demonstrated if the filling characteristics of patterned structures and micro-structural properties of plated copper are superior or even equivalent to the seeded structure of the prior art. For investigation, patterned SiO$_2$ substrates with different trench feature sizes were employed. One set of trenches was coated with 5 nm Ru:TaN barrier (Ru/Ta=30:1) and other with 12 nm PVD copper seed and same plating process conditions (10 mA/cm$^2$, 20 seconds, medium acid level electrolyte) were employed for patterned structure filling.

Selected area diffraction (SAD) patterns obtained from TEM analyses indicated polycrystalline copper grain structure in both sets of trenches. Some differences in the grain orientations were observed from SAD patterns on these two types of trenches. Plating on a multi-line width damascene structure using the same plating process parameters and Ru:TaN seed layer thicknesses indicated that platability of Ru:TaN barrier is similar to the seeded structure. Similar results were observed for plating in patterned low-k dielectric (porous SiCOH, k~2.3) substrates with 65 nm trench and via features.

Copper Diffusion Barrier Characteristics of Ru:TaN Films

For quantitative investigation of copper diffusion barrier characteristics of the liner films, the triangular voltage sweep (TVS) testing approach (9) was employed. The metal-oxide-semiconductor (MOS) capacitor structure fabricated for these tests was first biased at 20V (electric field in SiO$_2$: 0.2 MV/cm) at different stress anneal temperatures (100° C., 150° C., 200° C., 250° C.) for 10 min followed by a voltage sweep from 10V to −30V with a rate of 0.2V/sec. 6 nm thick Ru:TaN films with a series of metal ratios (Ru/Ta=14,30,80) were studied with respect to their copper diffusion barrier characteristics.

A peak leakage current density profile indicated that all Ru:TaN films show no sign of copper diffusion up to 150° C. stress anneal. A direct relationship between metal ratio in Ru:TaN and its copper diffusion barrier properties can be observed from this study.

Interestingly, the liner film with metal ratio Ru/Ta=14:1 exhibits no measurable leakage up to 200° C. stress anneal, confirming that Ru:TaN liner robustness as a copper barrier can be modulated by varying the liner composition.

Preliminary investigations have indicated that nano-laminate/mixed-phase Ru—TaN liners are potential solutions for direct-plate copper diffusion barrier applications. It was observed that the electrical resistivity and thermal stability, as well as the subsequent copper plating and diffusion barrier characteristics, were strongly dependent upon the Ru:Ta ratio in the deposited films. Direct plated copper films were found to exhibit preferred (111) orientation with the use of medium acid level electrolyte (0.8M $H_2SO_4$) and higher plating current density (10 mA/cm$^2$) during the copper electrochemical deposition process. Also, these films were found to possess larger grain size characteristics as compared to electroplated copper on PVD copper seed, which is a desirable property for higher electromigration resistance of plated copper films. Additionally, the copper filling characteristics in sub-65 nm features were found to be equivalent for seeded copper and seedless Ru:TaN barrier films, which indicates that several scalability issues with present tri-layer stack configuration (barrier/glue/copper seed) can be avoided in the upcoming interconnect geometries with the use of a single Ru:TaN nano-laminate type barrier.

The foregoing results demonstrate that the mixed phase nano-laminate barriers of present invention provides the necessary diffusion and adhesion properties for direct copper plating at scalable thicknesses not obtainable by the discrete layer barriers that intrinsically limit the development of interconnects to the next lower level. The nano-laminates at select Ru:Ta ratios possessed the requisite electrical resistivity and thermal stability, and diffusion barrier characteristics, and facilitated subsequent copper plating. Direct plated copper films were found to exhibit preferred (111) orientation with the use of medium acid level electrolyte (0.8M $H_2SO_4$) and higher plating current density (10 mA/cm$^2$) during the copper electrochemical deposition process. Also, these films were found to possess larger grain size characteristics as compared to electroplated copper on PVD copper seed, which is a desirable property for higher electromigration resistance of plated copper films. Additionally, the copper filling characteristics in sub-65 nm features were found to be equivalent for seeded copper and seedless Ru:TaN barrier films, indicating that several scalability issues with present tri-layer stack configuration (barrier/glue/copper seed) can be avoided in the emerging interconnect geometries with the use of a single Ru:TaN nano-laminate type barrier.

Having thus described a presently preferred embodiment of the present invention, it will now be appreciated that the objects of the invention have been fully achieved, and it will be understood by those skilled in the art that many changes in construction and widely differing embodiments and applications of the invention will suggest themselves without departing from the sprit and scope of the present invention. The disclosures and description herein are intended to be illustrative and are not in any sense limiting of the invention, which is defined solely in accordance with the following claims.

REFERENCES

1. M. W. Lane, C. E. Murray, F. R. McFeely, P. M. Vereecken, and R. Rosenberg, *Appl. Phys. Lett.*, 83, 2330 (2003).
2. H. Kim, T. Koseki, T. Ohba, T. Ohta, Y. Kojima, H. Sato, and Y. Shimogaki, *J. Electrochem. Soc.*, 152 (8) G594 (2005).
3. A. Radisic, G. Oskam, and P.C. Searson, *J. Electrochem. Soc.*, 151 (6) C369 (2004).
4. M. Tungare, S. Kumar, M. Li, and E. T. Eisenbraun, *Electrochem. Soc. Trans.* 3, (2) 303 (2006)
5. S. C. Chang, J. M. Shieh, B. T. Dai, M. S. Feng, and Y. H. Lic, *J. Electrochem. Soc.*, 149 (9) G535 (2002).
6. C. Suryanarayana and M. G. Norton, *X-ray diffraction: A practical approach*, Plenum press, New York and London (2003).
7. A. Radisic, J. G. Long, P. M. Hoffmann, P. C. Searson, *J. Electrochem. Soc.*, 148 (1) C41 (2001)
8. J. J. Kim, S. K. Kim, Y. S. Kim, *J. Electrochem. Soc.*, 151 (1) C97 (2004)
9. E. H. Niccolian and J. R. Brews, *MOS (metal oxide semiconductor) physics and technology*, Wiley, New York (1982).

What is claimed:

1. A microelectronic substrate comprising:
   a patterned substrate having depressions in the form of vias and/or trenches;
   a barrier on the exposed surfaces of said depressions comprising a plurality of alternating lamina of tantalum nitride (TaN) and ruthenium (Ru) applied by atomic layer deposition wherein the ratio of ruthenium to tantalum is effective for providing an exposed outer layer suitable for the direct electroplating of copper and the layer is effective for limiting the diffusion of copper into the substrate, wherein said barrier comprises at least four alternating lamina with a bottom layer at said patterned substrate consisting of tantalum nitride and an outer layer consisting of ruthenium.

2. The substrate as recited in claim 1 wherein said ratio is in the range by weight of about 8 to 16.

3. The substrate as recited in claim 1 wherein said ratio is in the range by weight of about 10 to 14.

4. The substrate as recited in claim 1 wherein said barrier at said depressions is filled with electroplated copper.

5. The substrate as recited in claim 1 wherein said laminas have a thickness of about 1 nm or less.

6. An interconnect structure for microelectronic substrates comprising:
   a patterned substrate having depressions in the form of vias and/or trenches each defined by spaced side walls and a base wall;
   an inner lamina of tantalum nitride on said side walls and said side walls having a thickness of about 2 nm, interior lamina on said inner lamina successively consisting of alternating layers of ruthenium and tantalum nitride each having a thickness of about 2 nm at terminating with an outer intermediate lamina of tantalum nitride, and a outer lamina of ruthenium overlying said interior lamina and having a thickness of about 2, said outer surface of said outer lamina for the wall of a cavity, and a copper material filling said cavity wherein said lamina are formed by plasma enhanced atomic layer deposition and wherein the ratio of ruthenium to tantalum is effective for providing an exposed outer layer suitable for the direct electroplating of copper and the layer is effective for limiting the diffusion of copper into the substrate.

* * * * *